United States Patent [19]

Knaack

[11] Patent Number: 5,682,356
[45] Date of Patent: Oct. 28, 1997

[54] MULTIPLE WORD WIDTH MEMORY ARRAY CLOCKING SCHEME FOR READING WORDS FROM A MEMORY ARRAY

[75] Inventor: Roland T. Knaack, Starkville, Miss.

[73] Assignee: Cypress Semiconductor Corp., San Jose, Calif.

[21] Appl. No.: 584,530

[22] Filed: Jan. 11, 1996

[51] Int. Cl.[6] .................. G11C 7/00; H01L 27/10
[52] U.S. Cl. .................. 365/236; 365/233; 365/239; 365/221
[58] Field of Search .................. 365/221, 230.01, 365/189.01, 233, 236, 239

[56] References Cited

U.S. PATENT DOCUMENTS

| | | | |
|---|---|---|---|
| 4,802,122 | 1/1989 | Auvinen et al. | 365/154 |
| 4,839,866 | 6/1989 | Ward et al. | 365/221 |
| 4,875,196 | 10/1989 | Spaderna et al. | 365/238 |
| 4,891,788 | 1/1990 | Kreifels | 365/49 |
| 5,084,837 | 1/1992 | Matsumoto et al. | 395/250 |
| 5,088,061 | 2/1992 | Golnabi et al. | 365/189.01 |
| 5,228,002 | 7/1993 | Huang | 365/221 |
| 5,262,996 | 11/1993 | Shiue | 362/221 |
| 5,305,253 | 4/1994 | Ward | 365/73 |
| 5,311,475 | 5/1994 | Huang | 365/221 |
| 5,317,756 | 5/1994 | Komatsu et al. | 395/800 |
| 5,367,486 | 11/1994 | Mori et al. | 365/189.05 |
| 5,404,332 | 4/1995 | Sato et al. | 365/201 |
| 5,406,273 | 4/1995 | Nishida et al. | 340/825.51 |
| 5,406,554 | 4/1995 | Parry | 370/58.1 |
| 5,462,612 | 10/1995 | Ichige et al. | 365/220 |
| 5,467,319 | 11/1995 | Nusinov et al. | 365/231 |
| 5,490,257 | 2/1996 | Hoberman et al. | 395/427 |
| 5,506,809 | 4/1996 | Csoppenszky et al. | 365/221 |
| 5,513,318 | 4/1996 | van de Goor et al. | 395/185.01 |
| 5,521,876 | 5/1996 | Hattori et al. | 365/221 |
| 5,546,347 | 8/1996 | Ko et al. | 365/221 |

FOREIGN PATENT DOCUMENTS

| | | |
|---|---|---|
| 1-113996 | 5/1989 | Japan . |
| 6-76559 | 3/1994 | Japan . |

OTHER PUBLICATIONS

Roland T. Knaack, U.S.S.N. 08/559,983, Multiple Word Width Memory Arry Clocking Scheme, filed Nov. 17, 1995.

*Primary Examiner*—Viet Q. Nguyen
*Attorney, Agent, or Firm*—Bliss McGlynn, P.C.

[57] ABSTRACT

The present invention provides a circuit for distributing data from a number of individual memory cells in a memory array to a common output. The present invention uses a multi-bit counter to distribute a timing signal to a number of sense amplifier blocks. Each of the sense amplifier blocks receives both a data input signal from the memory array and the timing signal at all times. When a particular timing signal is present at a sense amplifier, the output signal containing a fixed width data word is received from the corresponding memory array and is presented to the output. The present invention reduces the number of internal signal lines necessary to implement the control function and allows for easy modification to read multiple width words from the memory array.

15 Claims, 2 Drawing Sheets

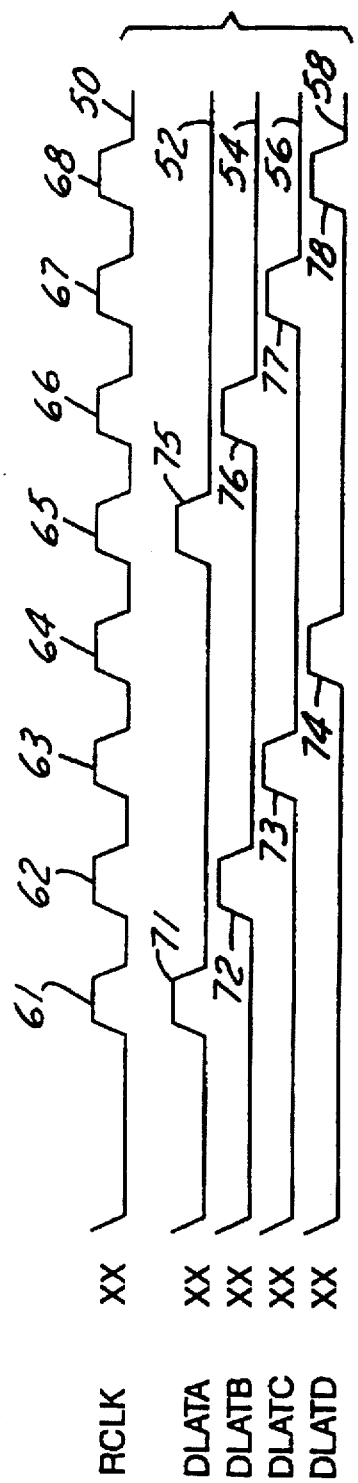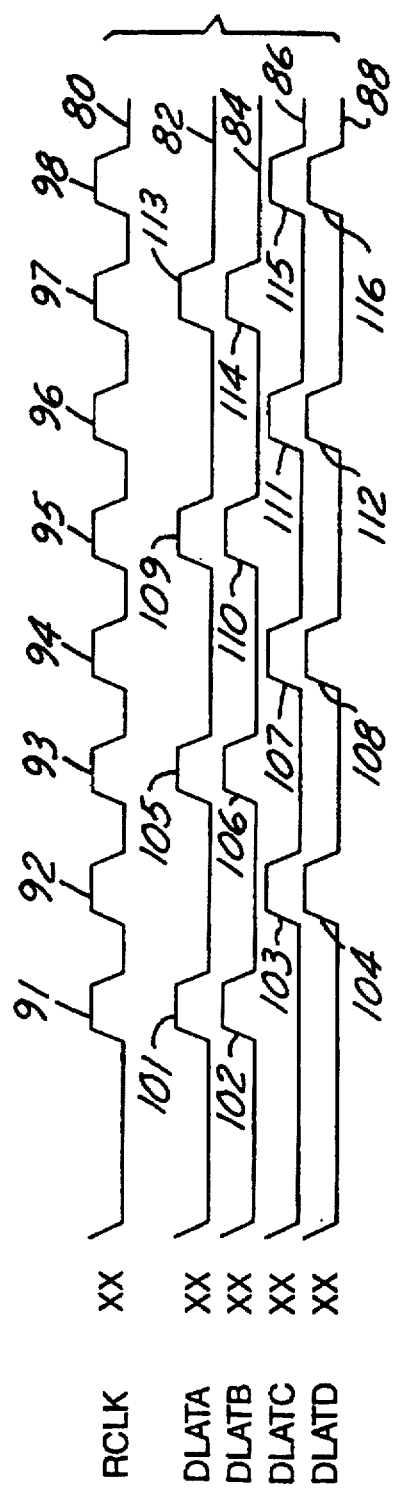

MULTIPLE WORD WIDTH MEMORY ARRAY CLOCKING SCHEME FOR READING WORDS FROM A MEMORY ARRAY

FIELD OF THE INVENTION

This invention relates to FIFO buffers generally and more particularly to a clocking scheme for allowing a contiguous memory array to be utilized to read various width data words from a memory array.

BACKGROUND OF THE INVENTION

It is well known to construct a first-in first-out(FIFO) buffer that reads various size data words from a memory array. The prior art required a shift register scheme to generate a number of intermediate signals necessary to incorporate a fixed word width data pack from the memory array. To implement a clocking scheme that retrieves fixed width data words that are equal to the width of the individual cells in the FIFO buffer, a 16-bit multiplexer would be required. To extend the prior art scheme to a memory array that is twice as wide as the width of the output data word, a 32-bit shift register would be required. Specifically, a 32-bit shift register would be necessary for a 9-bit word design and a 16-bit shift register would be required for a 18-bit word design. The prior art did not allow a single shift register to be used for both the 9-bit and 18-bit devices. The prior art FIFO's used a "carousel" type data retrieval scheme that used a 16-bit shift register to directly control each of the section signals. To extend the prior art system to read both a 9-bit and 18-bit word would require a 32-bit shift register. The implementation of a 32-bit shift register would cause extreme difficulty in routing the various signals to appropriately connect the outputs of the shift register to each of the section control blocks. The implementation of a 32-bit shift register would also consume more than twice the amount of chip area that a 16-bit shift register would consume.

Referring to FIG. 1, a prior art scheme is shown generally comprising a shift register 12, a set of sense amplifiers 14a, 14b, 14c and 14d and a set of memory arrays 16a, 16b, 16c and 16d. A single data output 18 represents an output from each of the sense amplifiers 14a–d. The 16-bit shift register 12 presents one of a set of control inputs 20a, 20b, 20c and 20d to each of the sense amplifiers 14a–d. When the control input 20a–d is present at one of the sense amplifiers 14a–d, the data output 18 is received from the appropriate memory array 16a–d and presented to the data output block. An individual control input 20a–d is required for each memory array 16a–d. As the number of memory arrays 16a–d increases, the number of control inputs 20 will also increase. Each of the select inputs 20a–d would need to be individually routed from the individual sense amplifiers 14a–d to the shift register 12. The routing necessary to appropriately connect the control inputs 20a–d between the shift register 12 and the sense amplifiers 14a–d increases. To expand the shift register 12 to a 32-bit shift register would require twice the amount of routing as well as an increased amount of chip real estate to implement the shift register 12. The increase in routing the control inputs 20a–d and the increased chip area makes the prior art scheme difficult to implement with multiple width data words.

SUMMARY OF THE INVENTION

The present invention provides a circuit for distributing data from a number of individual memory cells in a memory array to a common output. The present invention uses a multi-bit counter to distribute a timing signal to a number of sense amplifier blocks. Each of the sense amplifier blocks receives both a data input signal from the memory array and the timing signal at all times. When a particular timing signal is present at a sense amplifier, the output signal containing a fixed width data word is received from the corresponding memory array and is presented to the output. The present invention reduces the number of internal signal lines necessary to implement the control function and allows for easy modification to read multiple width words from the memory array.

Objects, features and advantages of the present invention are to provide a control circuit for distributing data from a number of memory arrays to a common output for use with both synchronous and asynchronous FIFO's as well as other memory devices. The circuit produces the distributing effect using a minimum number of signal lines, eliminates the need to use a wide bit shift register, can be very easily adopted to larger or smaller memory organization systems with minimum design changes, consumes less overall chip real estate and can easily be adopted to denser and wider memory devices with multiple data output word widths.

BRIEF DESCRIPTION OF THE DRAWINGS

These and other objects, features and advantages of the present invention will be apparent from the following detailed description and the appended claims in which:

FIG. 3 is a timing diagram illustrating the effect of the present invention using a 9-bit data word; and FIG. 4 is a timing diagram illustrating the implementation of the present invention using an 18-bit data word.

DETAILED DESCRIPTION OF THE PREFERRED EMBODIMENT

Figure 1:
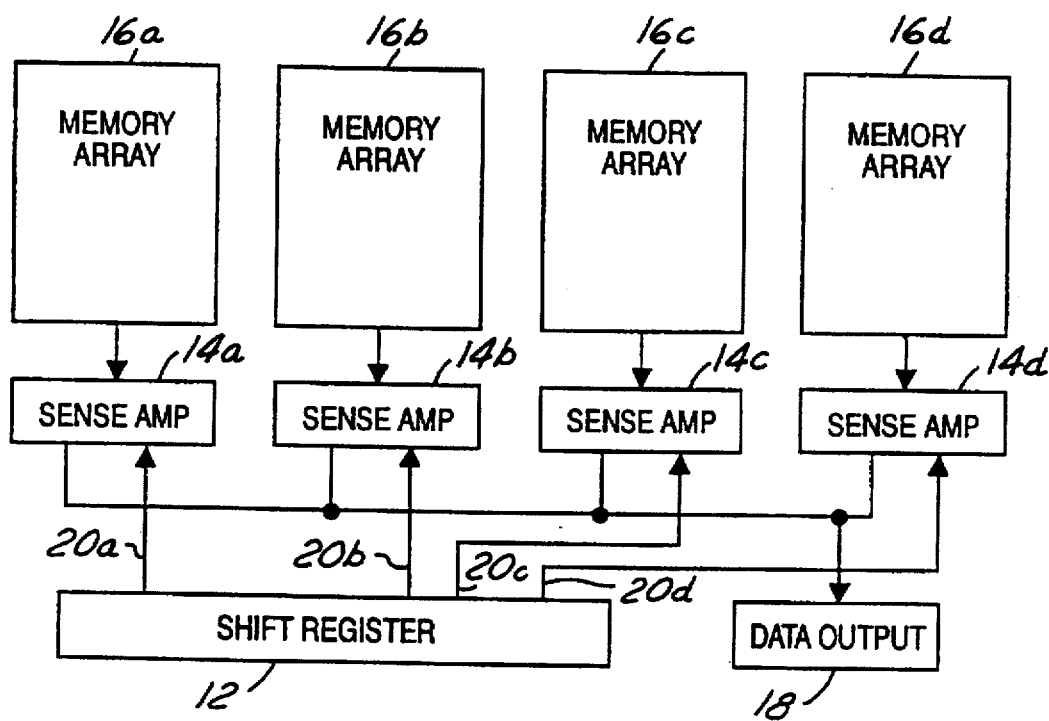
FIG. 1 is a block diagram of a prior art scheme.
Figure 2:
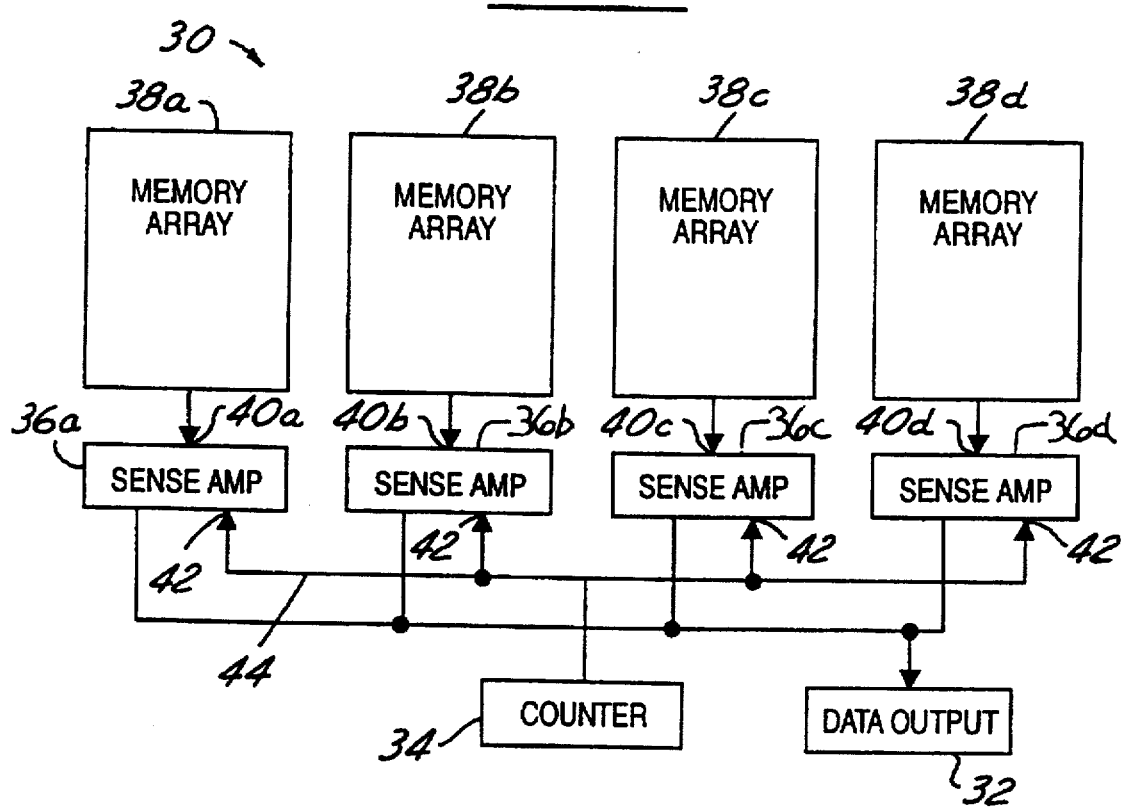
FIG. 2 is a block diagram of the presently preferred embodiment of the invention.

Referring to FIG. 2, a block diagram of a clocking circuit 30 is shown in accordance with a presently preferred embodiment of the invention. The clocking circuit 30 generally comprises a data output 32, a counter 34, a set of sense amplifiers 36a, 36b, 36c and 36d and a set of memory arrays 38a, 38b, 38c and 38d. Each of the sense amplifiers 36a–36d have a signal input 40 and a timing input 42. The signal input 40 of each of the sense amplifiers 36a–36d is presented to the data output 32 when a particular timing input is present. As a result, each of the sense amplifiers 36a–36d receive the signal input 40 at all times. The signal input 40 comprises a stream of fixed width data words from the memory array that can be either a single bit or multiple bits.

While each of the sense amplifiers 36a–36d will receive the signal input 40 at all times, only certain specific sense amplifiers 36a–36d will present the input 40 from the corresponding memory array 38a–38d to the data output 32 at any given time. The particular sense amplifier 36a–36d that presents data to the data output 32 from the corresponding memory array 38a–38d at a particular time is determined by a signal present at the timing input 42. The timing input 42 receives a timing signal from a timing bus 44 connected to the counter 34. Each of the sense amplifiers 36a–36d receive the timing signal at the timing input 42 at all times. The counter 34 produces the timing signal that is a unique multi-bit digital word that changes with each clock cycle. A counter 34, when implemented as a 4-bit counter, produces a 4-bit digital word that produces 2 to the 4th, or 16, unique states. A 5-bit counter produces a 5-bit digital word that produces 2 to the 5th, or 32, unique states. As a result, the addition of a single bit to the counter 34 and the bus 44 doubles the capabilities of the clocking circuit 30. Each unique state produced by the counter 34 provides a specific timing signal that only certain specific sense amplifiers 36a–36d will recognize.

A specific example of a particular implementation of the present invention will be described where the memory arrays 38a–d are 9-bit devices and the data output signal 32 is a stream of 9-bit digital words. When a first word is received by the sense amplifier 36a from the memory array 38a and presented to the data output 32, the sense amplifiers 36b, 36c and 36d connected to the memory arrays 38b, 38c and 38d have a timing signal present at the timing inputs 42 and a digital word present at the signal inputs 40b, 40c and 40d but do not present the digital word from the memory arrays 38b, 38c and 38d to the data output 32. When the first digital word is completely loaded through the sense amplifier 36a from the memory array 38a to the data output, the timing signal will continue to be present at the timing input 42. The timing signal will then change and be recognized at the timing input 42 of the sense amplifier 36b connected to the memory array 38b. At this point a second digital word from the memory array 38b will be loaded through the sense amplifier 36b and presented to the data output 32. The sense amplifiers 36a, 36c and 36d connected to the memory arrays 38a, 38c and 38d will not present the next digital word from the memory arrays 36a, 36c and 36d during this time. A similar word reading is accomplished when the memory arrays 38c and 38d present data words to the sense amplifiers 36c and 36d and on to the data output 32.

It should be appreciated that each of the memory arrays 38a, 38b, 38c and 38d have a corresponding sense amplifier 36a, 36b, 36c and 36d. Each of the sense amplifiers 36a–36d recognize only a specific multi-bit timing signal present at the timing input 42. Only one of the sense amplifiers 36a–36d recognizes the specific multi-bit timing word at any given clock cycle and processes the digital word present at the particular signal input 40a–d. Effectively, each of the sense amplifiers 36a–36d act as a digital valve. The digital valve effect of the sense amplifiers 36a–36d effectively opens when the proper multi-bit timing word is present at timing input 42, receiving an input from the appropriate memory array 38a–38d and presenting it to the data output 32. Each of the sense amplifiers 36a–36d work in combination to completely load a digital word from one of the memory arrays 38a–38d on a given clock cycle before the next digital word from the next memory array 38a–38d is loaded into the data output 32 at the next clock cycle. The order that the digital words are received from the memory arrays 38a–38d can be any order necessary to fit the design criteria of a particular application. The sequential reading of memory array 38a, then 38b, then 38c, etc. is for illustrative purposes only.

The example illustrated using the 9-bit memory arrays 38a–d and the 9-bit digital words as the data output 32 has a one word per timing signal relationship. In an application where the width of the digital word is a multiple of the width of the memory arrays 38a–d, each fraction (i.e. one half, one third, one fourth, etc.) of the digital word would be read from a separate one of the memory arrays 38a–d on each clock cycle. As a result, the present invention would read a multi width digital word from the memory arrays 38a–38d wherein multiple sense amplifiers 36a–36d respond to a particular timing signal.

It is generally advantageous for a manufacturer to produce the smallest number of components necessary to maintain all product lines in current production. As a result, from a practical aspect, the present invention would be implemented using a counter 34 that is five-bits wide for all applications that require either 16 unique states or 32 unique states. If only 16 unique states are required for a particular design application, only four of the bits on the counter would be used with one of the bits being disabled. For example, the most significant bit would be disabled if the counter 34 was implemented as an up counter. Other counters could be used that produce a unique state at each clock cycle, such as a random counter. The approach of providing additional bits in the counter 34 is practical since the addition of an additional counter output signal line would be less expensive than producing two separate parts. This is in contrast to the prior art where a 32-bit shift register is far more difficult to manufacture than a 16-bit shift register. To maintain a single component using the prior art techniques, the much more complex 32-bit shift register would have to be produced on each device, even if only a 16-bit shift register portion is actually used.

Referring to FIG. 3, a timing diagram illustrating the functioning of the present invention when operating with a series of 9-bit data words as an output is shown. It should be appreciated that the example illustrated in FIG. 3 uses a 9-bit digital word for illustrative purposes only. Any fixed width digital word, including a single bit word, can be used without departing from the spirit of the invention. FIG. 3 generally comprises a Rclk signal clock 50, a dlatA signal 52, a dlatB signal 54, a dlatC signal 56 and a dlatD signal 58. The dlatA, dlatB, dlatC and dlatD signals provide pulses that represent when a word is received from a corresponding memory array 38a–38d. The digital high portions of the Rclk clock 50 are shown as pulses 61, 62, 63, 64, 65, 66, 67 and 68.

When the Rclk clock 50 is high at pulse 61, the dlatA signal 52 is shown as being high at a pulse 71. This reads a full 9-bit digital word from the memory array 38a. When the Rclk clock 50 is high at the pulse 62, the dlatB signal 54 is shown as being high at pulse 72. When the Rclk clock 50 is shown as being high at the pulse 63, the dlatC signal 56 is shown as being high at a pulse 73. Similarly, when the Rclk clock 50 is shown as being high at the pulse 64, the dlatD signal 58 is shown as being high at a pulse 74. The pulses 71, 72, 73 and 74 represent the reading of a 9-bit digital word from a respective one of the memory arrays 38a, 38b, 38c and 38d. After the dlatD signal 58 reads a word shown as the pulse 74, the next data word is read from the memory array 38a when the dlatA signal 52 is high at a pulse 75. A similar effect is shown with a pulse 76, a pulse 77 and a pulse 78. A direct relationship is shown where a single word is read from the memory array 38a, then a single digital word is read from the memory array 38b, then a single digital word is read from the memory array 38c and finally a single digital word is read from the memory array 38d. After the digital word is read from the memory array 38d, the process starts again with reading a digital word from the memory array 38a.

It should be appreciated that the number of memory arrays 38a–38d is shown to be four for illustrative purposes only. The number of memory arrays 38a–d can be extended to any number of memory arrays desired for a particular design application or can be reduced to a single memory array. Increasing or decreasing the number of memory arrays would only require replacing the counter 34 with a counter having a sufficiently wide bit path to provide a sufficient number of independent states to accommodate the number of words read from the number of memory arrays 38a–d that are implemented. The width of the bit path would be determined by the width of the digital word, the width and number of the memory arrays 38a–d and the desired order of the reading of the memory arrays 38a–d. To accommodate these adjustments, the width of the bit path may have to be increased, decreased or left unchanged. The order of the reading from the memory arrays 38a–38d can be any order necessary to fit the design criteria of a particular application. The sequential reading of memory array 38a, then 38b, then 38c, etc., is for illustrative purposes only.

Referring to FIG. 4, an 18-bit data word width implementation of the present invention is illustrated. It should be appreciated that an 18-bit digital word is used for illustrative purposes. The 18-bit data word is considered a double width digital word as compared to the width of the memory arrays 38a–38d. Any multiple of the width of the memory array can be used. FIG. 4 generally comprises a Rclk clock 80, a dlatA signal 82, a dlatB signal 84, a dlatC signal 86 and a dlatD signal 88. Since the data word is 18-bits wide and the individual memory arrays 38a–38d are 9-bits wide, a slightly different reading protocol is necessary. The 18-bit digital word is comprised of a number of fractional portions read from two of the memory arrays 38a–38d. The digital high portions of the Rclk clock 80 are shown as pulses 91, 92, 93, 94, 95, 96, 97 and 98.

When the Rclk clock 80 is high at the pulse 91, a first fraction, or half, of a 18-bit digital word is read from the memory array 38a and is shown as a pulse 101 on the dlatA signal 82. A second fraction, or half, of the 18-bit digital word is read from the memory array 38b and is shown as the dlatB signal 84 as a pulse 102. When the Rclk clock 80 is high at the pulse 92, a first fraction, or half, of the next 18-bit digital word is read from the memory array 38c as shown on the dlatC signal 86 as a pulse 103. The second fraction, or half, of the next 18-bit digital word is read from the memory array 38d as shown on the dlatD signal 88 as a pulse 104. When the Rclk clock 80 is high at the pulse 93, a first fraction, or half, of the next 18-bit digital word is read from the memory array 38a as shown as pulse 105 of dlatA signal 82. A second fraction, or half, of the next 18-bit digital word is read from the memory array 38b as shown by the pulse 106 on the dlatB signal 84. A series of pulses 107, 108, 109, 110, 111, 112, 113, 114, 115 and 116 show similar reading of 18-bit digital words between either the dlatA signal 82 and dlatB signal 84 or the dlatC signal 86 and the dlatD signal 88. Each of the pulses 101–116 illustrates a 9-bit half of an 18-bit digital word read from one of the 9-bit wide memory arrays 38a–38d. The order of which memory arrays 38a–38d are read from can be adjusted to fit the design criteria of a particular application by programming the sense amplifiers 36a–36d to respond to a timing signal that produces a non-sequential reading of the memory arrays 38a–d.

The example of the present invention illustrated in FIGS. 3 and 4 can be extended to reading larger or smaller width digital words. While the FIG. 4 illustration was limited to reading a double width digital word, a triple, quadruple or other width digital word could be accomplished by extending the plurality of fractional portions of the digital word accordingly. The clocking circuit 30 can be programmed to read any multiple width digital word. The programming can be either during production of the clocking circuit 30, after production by using an external device to program the clocking circuit 30 or by any other programming scheme contemplated. Larger or smaller width memory arrays 38a–38d could also be accommodated. Also, a larger or smaller number of memory arrays 38a–38d could also be included. In any of the above modifications, the size of the counter 34 would have to be adjusted accordingly. This adjustment would be minor since the addition of a single bit to the counter 34 doubles the number of possible independent states.

It is to be understood that modifications to the invention might occur to one with skill in the field of the invention within the scope of the appended claims.

I claim:

1. A circuit for generating a multiple width word from one or more memories comprising:

a plurality of memory devices each having an output for presenting one or more fixed width digital words;

counter means providing a timing signal changing to a different value on each cycle of a clock input; and a plurality of sense amplifiers receiving said memory device outputs and said timing signal, wherein when said timing signal is present at least one of said sense amplifiers forms a multiple-width word by presenting said fixed width digital words from said memory array outputs in an order defined by said timing signal.

2. The circuit according to claim 1 wherein each of said plurality of memory devices is a fixed width memory array.

3. The circuit according to claim 1 wherein each of said plurality of memory devices comprises a fixed width memory array having a width equal to the width of said fixed width digital word.

4. The circuit according to claim 2 wherein the width of each fixed width memory array is a fraction of the width of said fixed width digital words.

5. The circuit according to claim 4 wherein each of said fixed width digital words has a plurality of fractional portions, each of said memory arrays presenting one or more of said fractional portions.

6. The circuit according to claim 1 wherein said sense amplifiers form a stream of said multiple width digital words.

7. The circuit according to claim 6 further comprising means for programming said circuit to vary the width of said multiple width digital words.

8. The circuit according to claim 4 wherein the width of each memory array is one half of the width of said fixed width digital words.

9. The circuit according to claim 8 wherein each of said fixed width digital words has a first half and a second half, said first half of each of said digital words is read from one of said memory arrays and said second half of each of said digital words is read from another one of said memory arrays.

10. The circuit according to claim 7 further comprising means for adjusting the size of said counter.

11. The circuit according to claim 4 wherein said fraction is selected from a group consisting of one half, one third and one fourth.

12. The circuit according to claim 1 wherein said multiple data width is formed by presenting a plurality of fixed width digital words from said memory array outputs.

13. The circuit according to claim 1 wherein two or more sense amplifiers form said multiple width digital word.

14. The circuit according claim 1 wherein said counter comprises a number of bits and produces an independent state at each clock cycle, the number of said independent states doubling from each additional bit.

15. The circuit according to claim 1 wherein each of said multiple width digital words comprises a plurality of said fixed width digital words.

* * * * *